(12) United States Patent
Guiheen et al.

(10) Patent No.: US 6,586,130 B1
(45) Date of Patent: Jul. 1, 2003

(54) METHOD AND APPARATUS FOR DETERMINING THE STATE OF CHARGE OF A LITHIUM-ION BATTERY

(75) Inventors: James V. Guiheen, Madison, NJ (US); Harmohan Singh, Rockaway, NJ (US); Thirumalai G. Palanisamy, Morristown, NJ (US)

(73) Assignee: Honeywell International Inc., Morristown, NJ (US)

( * ) Notice: Subject to any disclaimer, the term of this patent is extended or adjusted under 35 U.S.C. 154(b) by 110 days.

(21) Appl. No.: 09/721,003

(22) Filed: Nov. 22, 2000

(51) Int. Cl.$^7$ ................................................ H01M 10/44
(52) U.S. Cl. ............................................ 429/50; 429/92
(58) Field of Search ............................... 429/90, 91, 92, 429/93, 61, 62, 50, 52; 320/148, 149, 124, 125, 134, 136, DIG. 10, DIG. 18, DIG. 21

(56) References Cited

U.S. PATENT DOCUMENTS

| | | | |
|---|---|---|---|
| 4,725,784 A | 2/1988 | Peled et al. | |
| 5,694,023 A | * 12/1997 | Podrazhansky et al. | ....... 320/21 |
| 6,065,182 A | 5/2000 | Eguchi | |
| 6,111,389 A | 8/2000 | Aranovich et al. | |

FOREIGN PATENT DOCUMENTS

FR    2 734 061 A    11/1996

OTHER PUBLICATIONS

International Search Report PCT/US01/43735; Aug. 6, 2002.

* cited by examiner

*Primary Examiner*—Stephen Kalafut
*Assistant Examiner*—Raymond Alejandro

(57) ABSTRACT

Computer-assisted methods for determining the state of charge of a specific lithium ion battery, without the need for charging and discharging the battery, by utilizing look-up tables or algorithms which store the relationships of state of charge to open-circuit voltage or to ramp-peak current, or to both for that type of specific lithium-ion battery to determine the state of charge for that specific lithium-ion battery.

6 Claims, 3 Drawing Sheets

METHOD AND APPARATUS FOR DETERMINING THE STATE OF CHARGE OF A LITHIUM-ION BATTERY

FIELD OF INVENTION

This invention relates to the charging of lithium-ion batteries and more specifically to the determination of the optimum charging currents for lithium ion batteries.

BACKGROUND OF THE INVENTION

Lithium-ion secondary batteries are quickly gaining favor due to their lightweight and high energy density. Before now, chargers were built to charge the battery under relatively low currents for long periods of time, so as to avoid battery heating and electrode damage. Alternately, a relatively high fixed current was used which was known to be in a safe current regime for a newly manufactured battery. As the battery ages, or if a different battery is placed on a given charger, the fixed current may exceed the safe current regime, at which time battery heating and electrode damage might occur.

In order to save time in the charging of lithium-ion batteries and to still assure the safety of the charging technique, it is desirable to be able to determine an optimum charging current. Further, to improve the charging techniques it is desirable to be able to have knowledge of the state of charge (SOC) and capacity of the battery being charged. Priorly in the art, SOC and capacity were obtained by fully charging and discharging the battery in question and tracking the corresponding battery voltage vs. energy input/output. This charging and discharging of each battery to be charged again requires time but also uses energy.

A need therefore exists for methods that can determine the optimum charging current for safely yet time-effectively charging a specific lithium-ion battery. There also exists the related need for determining the SOC of the battery as part of the determination of the optimum charging current determination without the need to charge and discharge the specific battery to be charged.

SUMMARY OF THE INVENTION

We have found that the optimal charging current of a lithium-ion battery can be determined by performing a series of charging experiments utilizing varying initial charging currents, and by then recording cell voltage, cell temperature, and charging time. Specifically, we have found that the controlling variable in determining the optimum charging current is the state of charge (SOC) of the battery. The storage capacity of a battery is typically specified in Amp-Hours (Ah), where 1 Ah=3600 coulombs, and the state of charge (SOC) of a battery is defined as the actual charge stored in a given battery capacity divided by the storage capacity of that battery.

In accordance with one aspect of our invention, look-up tables or algorithms for each type of lithium-ion battery are prepared and stored in a computer or database. These look-up tables co-relate either open-circuit voltage vs. state of charge or ramp-peak current vs. state of charge for each type of lithium-ion battery, or include both co-relations. Our invention includes both the method steps for creation of the look-up tables as well as the use of the look-up tables in determining the optimum charging current for a particular lithium-ion battery.

DESCRIPTION OF THE INVENTION

Method 1—Open-circuit Voltage vs. State of Charge

One embodiment of our invention is a method to determine the state of charge of a lithium-ion battery based upon the measured open-circuit voltage for that battery.

Figure 1:
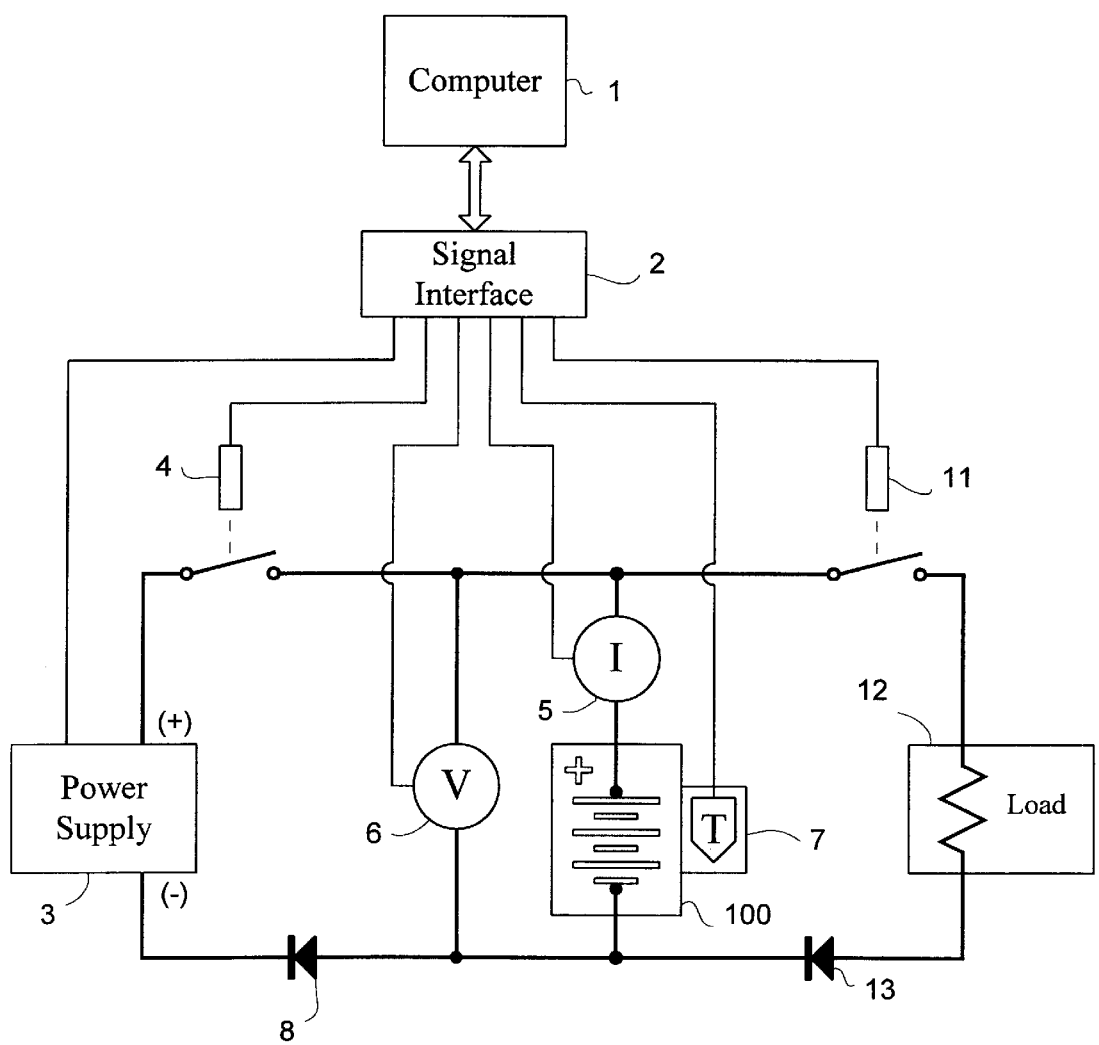
FIG. 1 shows a battery measurement circuit that is suitable for use with one illustrative embodiment of our invention.

Referring to FIG. 1, a lithium-ion battery 100, of a known type, is shown in a measurement circuit including voltmeter 6, ammeter 5, and thermocouple 7. Power supply 3 can be used to charge battery 100 when battery-charging relay 4 is activated. Blocking diode 8 is used to limit the direction of current flow so that current flows only from the power supply 3 to the battery 100 during charging. The battery 100 can be discharged through load 12 and blocking diode 13 when battery-discharging relay 11 is activated. The circuit of FIG. 1 can be used both to create the look-up tables of our invention and to determine optimum charging current using those tables.

A computer 1 receives voltage measurements from voltmeter 6 via a signal interface 2. The computer 1 also receives battery temperature measurements from thermocouple 7 and electrical current measurements from ammeter 5 via the signal interface 2. The computer 1 also controls the on-off states of the battery charging relay 4 and the battery-discharging relay 11 via the signal interface 2.

The computer 1 can be, for example, a Gateway Pentium computer with a National Instrument data acquisition module installed therein. The signal interface 2 can be, for example, a National Instruments signal conditioning system with a digital to analog converter (DAC) module, an analog to digital converter module (ADC), a relay control module, and a thermocouple module installed therein. The voltmeter 6 can be, for example, included as a channel of the ADC module. The ammeter can be for example, comprised of a 50-amp/50-millivolt shunt and a channel of the ADC module. The power supply 3 can be, for example, a Hewlett-Packard model 6032A power supply.

The circuit shown in FIG. 1 can be used to create a look-up table of open-circuit voltage (OCV) versus state of charge (SOC) for a particular type of lithium-ion battery as follows. First, the battery-charging relay 4 is activated and the battery-discharging relay 11 is deactivated. Next, the battery 100 is charged at an initial constant current ($I_O$), for example 1 amp, by increasing the output voltage of power supply 3 while monitoring charging current into the battery 100 using ammeter 5. The battery 100 is charged at this constant current, for example 1 amp until the voltage across the battery, as measured by voltmeter 6 reaches a maximum permitted voltage ($V_{Max}$). A battery manufacturer determines $V_{Max}$ based on safety considerations. A typical value of $V_{Max}$ for lithium-ion batteries is 4.2 volts per cell. For a battery 100 consisting of a multiple cells connected in series;

$$V_{Max_{Battery}} = V_{Max_{Cell}} * N \qquad \text{Eq. 1}$$

where N is the number of cells connected in series. When $V_{Max}$ is reached, charging is continued at this constant voltage, $V_{Max}$, and the charging current is reduced (float charging). When the input current decreases to a certain point, for example to 1% of the initial constant current, the cells being charged are considered to be fully charged and at 100% SOC. The battery-charging relay 4 is then deactivated and the battery 100 is allowed to stabilize, where battery stabilization is determined by the variation in the open-circuit voltage (OCV) of the battery 100 as measured by voltmeter 6. The battery 100 is considered to be stabilized when the rate of change of the OCV is less than a threshold, for example 0.0001 volts/minute. Stabilization time for a lithium-ion battery can be about 30 minutes. The battery 100 open-circuit voltage at 100% SOC ($OCV_{SOC=100\%}$) is recorded after the battery 100 is stabilized.

Second, the battery 100 is discharged at a predetermined discharge rate to a lower cutoff voltage ($V_{Min}$) through load 12 by activating the battery-discharging relay 11 and deactivating the battery-charging relay 4. The predetermined discharge rate can be selected as the value to completely discharge the battery, from 100% SOC to 0% SOC, in a time ranging from between 30 minutes to 5 hours. A battery manufacturer determines $V_{Min}$ based on safety considerations. A typical value of $V_{Min}$ for lithium-ion batteries is 3.0 volts per cell. For a battery 100 consisting of a multiple cells connected in series;

$$V_{Min_{Battery}} = V_{Min_{Cell}} * N \qquad \text{Eq. 2}$$

where N is the number of cells connected in series. When $V_{Min}$ is reached, the cells are fully discharged and at 0% SOC. The battery-discharging relay 11 is then deactivated and the battery 100 is allowed to stabilize, where battery stabilization is determined by the variation in the open-circuit voltage (OCV) of the battery 100 as measured by voltmeter 6. The battery 100 is considered to be stabilized when the rate of change of the OCV is less than a threshold, for example 0.001 to 0.005 volts/minute. Stabilization time for a lithium-ion battery can be about 30 minutes. The battery 100 open-circuit voltage at 0% SOC ($OCV_{SOC=0\%}$) is recorded after the battery 100 is stabilized. The capacity of the battery 100 can be calculated by multiplying the discharge rate (amp) by the discharge time (hours). Note that battery capacity is typically specified in Amp-Hours (Ah), where 1 Ah equals 3600 coulombs.

Third, a predetermined number of coulombs, for example 10% of the battery capacity, is charged (input) into the battery 100 from power supply 3 at a predetermined charge rate by activating the battery-charging relay 4 and deactivating the battery-discharging relay 11. The predetermined charge rate can be selected as the value to completely charge the battery 100, from 0% SOC to 100% SOC, in a time ranging from between 30 minutes to 5 hours. The battery-charging relay 4 is then deactivated and the battery 100 is allowed to stabilize, where battery stabilization is determined by the variation in the open-circuit voltage (OCV) as previously described. The battery 100 open-circuit voltage at 10% SOC ($OCV_{SOC=10\%}$) is recorded after the battery 100 is stabilized. This procedure is repeated and a set of battery 100 open-circuit voltages at various states of charge (e.g. 20%, 30%, . . . 90%) are recorded. In another embodiment of our invention, the open-circuit voltage (OCV) is measured immediately at the conclusion of each charging interval and the measured value is extrapolated to obtain an estimate of the stabilized OCV.

Advantageously, additional tables of open-circuit voltage (OCV) versus state of charge (SOC) are prepared for various temperatures by performing the chargedischarge-charge procedure previously described at, for example, temperatures of −30° C., 0° C., +20° C., and +50° C.

Figure 2:
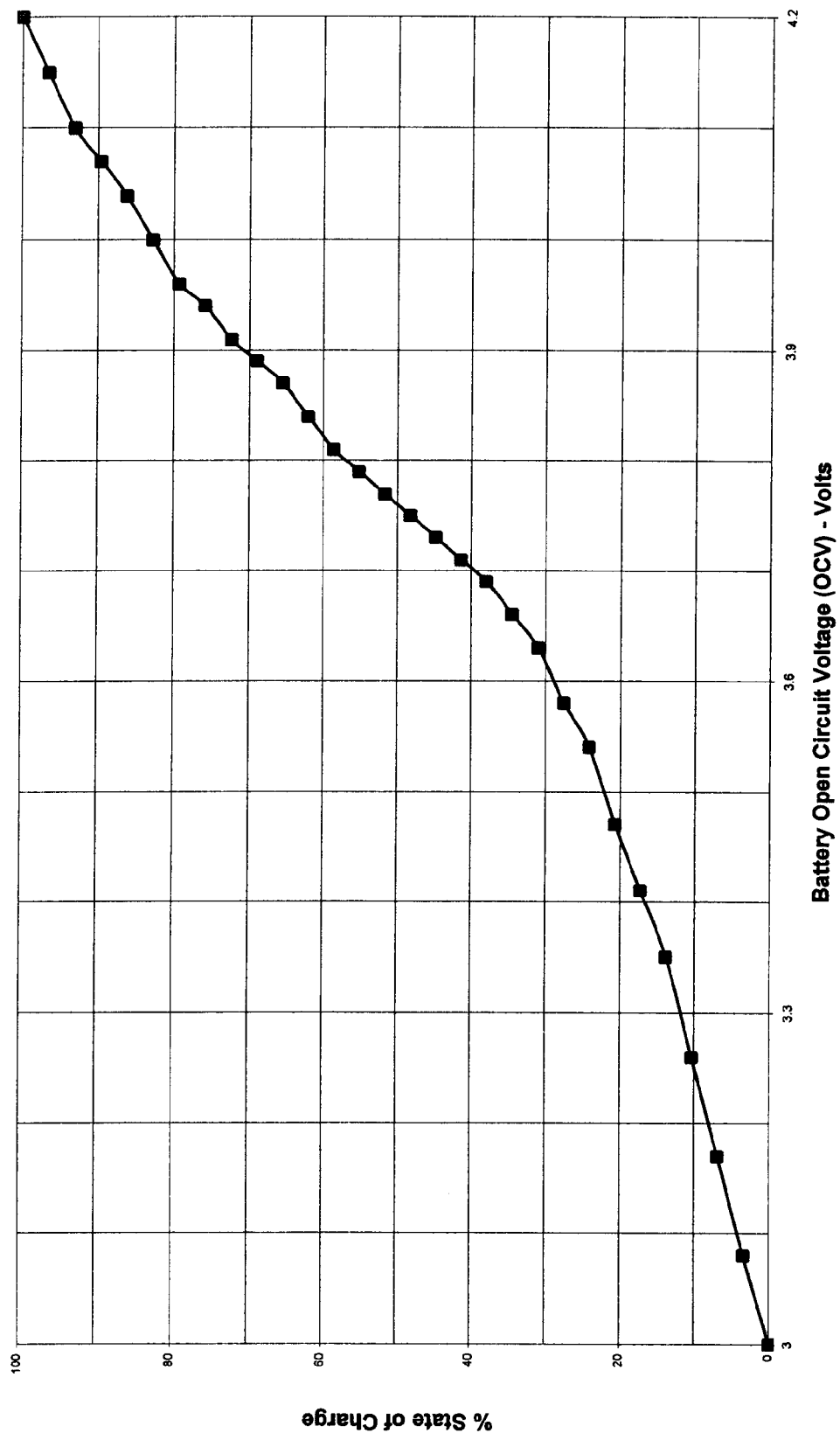
FIG. 2 shows a sample plot of open-circuit voltage vs. state of charge for a typical lithium ion battery.

Referring again to FIG. 1, a lithium-ion battery 100 of a known type, but with an unknown state of charge (SOC) is placed in a measurement circuit consisting of voltmeter 6 with both the battery charging relay 4 and the battery discharging relay 11 deactivated. The voltmeter 6 is connected through signal interface 2 to computer 1. A technician operating the computer 1 can input the battery type of battery 100 into the computer. The computer 1 will then execute an OCV correlation algorithm, for example a table look-up followed by linear interpolation, to correlate the open-circuit voltage (OCV) measured by the voltmeter with the state-of-charge for the type of battery 100 under test. FIG. 2 shows a sample plot of open-circuit voltage vs. state of charge for a typical lithium ion battery.

In accordance with a further aspect of our invention, a thermocouple 7 is attached to the side of battery 100 to provide battery temperature as an input to computer 1 via signal interface 2. The OCV correlation algorithm will now use three inputs—battery type, open-circuit voltage, and battery temperature. For example, linear interpolation or a similar calculation can calculate state of charge (SOC) for a battery 100 at a temperature intermediate to temperature values associated with stored tables.

Method 2—Ramp-Peak Current vs. State of Charge

An alternate embodiment of our invention is a method to determine the state of charge of a lithium-ion battery based upon the measured ramp-peak current for that battery.

The circuit shown in FIG. 1 can also be used to create look-up table of ramp-peak current (RPC) versus state of charge (SOC) for a particular type of lithium-ion battery as follows. First, the battery 100 is brought to a known state of charge (e.g. 10% SOC) by using, for example, the steps described in method 1 above.

Second, the battery-charging relay is activated and the battery-discharging relay is deactivated and a monotonically increasing current, for example an electrical current increasing from 0 amps to 20 amps in 60 seconds, is applied to the battery 100 by the power supply 3. The dependence of current increase with time, I=f(t), can be a linear function and is recorded by computer 1. As the input current is increased from 0 either 1) the input current causes the battery voltage to reach its maximum permitted voltage ($V_{Max-ramp}$), as measured at voltmeter 6, or 2) the input current equals a maximum current rating of the power supply 3, or 3) a current limit chosen for the battery. The maximum permitted ramp voltage can be set at 100 mV to 200 mV above the maximum permitted charge voltage, since the duration of ramp energy input is limited. The electrical current, at which either 1) or 2), above occurs, is defined as the battery ramp-peak current (RPC). When the battery 100 RPC is reached, the battery-charging relay 4 is deactivated and the battery 100 ramp-peak current at 10% SOC ($RPC_{SOC=10\%}$) is recorded. This procedure is repeated and a set of battery 100 ramp-peak currents at various states of charge (e.g. 20%, 30%, . . . 100%) are recorded.

Note there is a possibility for a battery of a known type that there may be several low states of charge (SOC), for example 10% SOC and 20% SOC, that correspond to a duplicate RPC value that is limited by the current rating of the power supply 3. In this case, the rate of charge current can be increased, for example from 0 amps to 20 amps in 30 seconds, in order to create differing values of RPC corresponding to true state of charge of battery 100.

Further in accordance with our invention, additional tables of ramp-peak current (RPC) versus state of charge (SOC) may be prepared for various temperatures by performing the current ramping procedure previously described at, for example, temperatures of −30° C., 0° C., +20° C., and +50° C.

Figure 3:
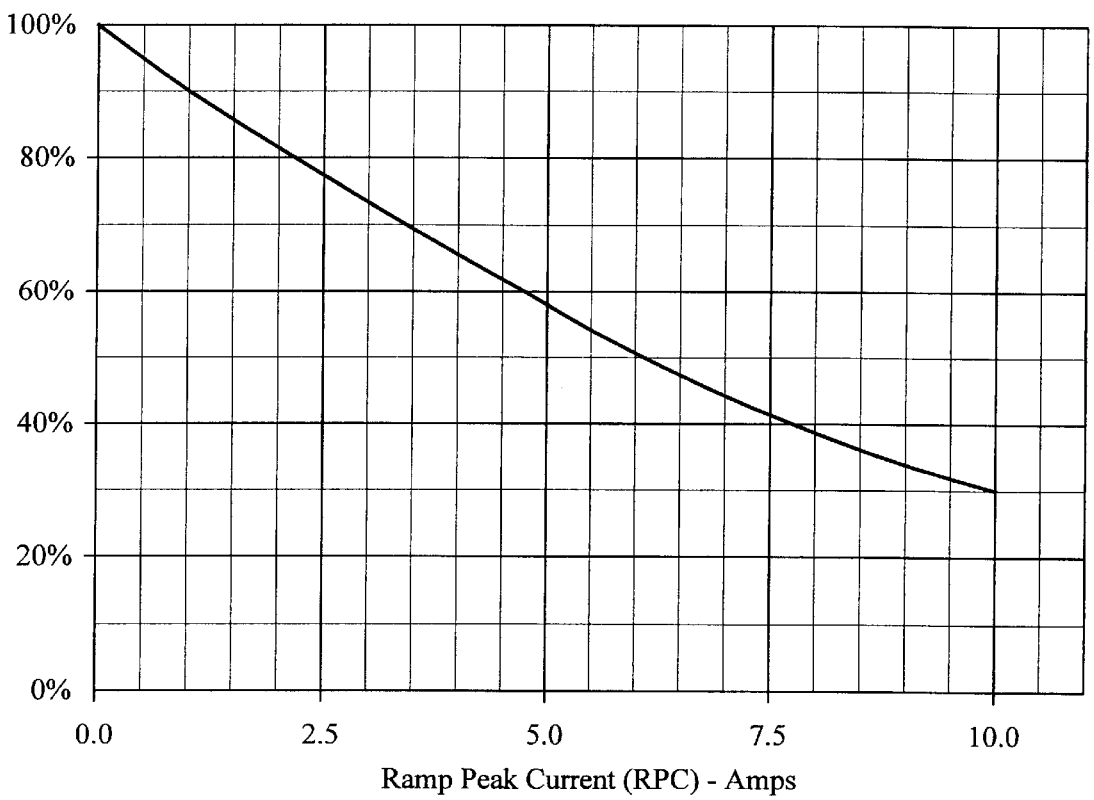
FIG. 3 shows a sample plot of ramp-peak current vs. state of charge for a typical lithium ion battery.

Referring again to FIG. 1, a lithium-ion battery 100 of a known type, but with an unknown state of charge (SOC) is placed in a measurement circuit consisting of power supply 3, ammeter 5, and voltmeter 6 and with both the battery charging relay 4 and the battery discharging relay 11 deactivated. The power supply 3, ammeter 5, and voltmeter 6 are connected through signal interface 2 to computer 1. A technician operating the computer 1 can input the battery type of battery 100 into said computer. The computer 1, will then execute a control-loop to activate the battery-charging relay 4 and monotonically increase the charging current, for example from 0 amps to 20 amps in 60 seconds, in accordance with a stored look-up table of the dependence of current increase with time, I=f(t). The computer 1 increases the battery 100 input current from power supply 3 until it reaches RPC as described above and then the computer 1 deactivates the battery-charging relay 4. The computer 1, will then execute an RPC correlation algorithm, for example a table look-up followed by linear interpolation, to correlate the ramp-peak current (RPC) as measured by the ammeter 5 with the ramp-peak current for the type of battery 100 under test. If there is a case where the computer 100 correlation algorithm returns multiple possible ramp-peak current (RPC) values, then the computer 1 shall advise the user that the battery SOC is less than or equal to the highest possible state of charge (SOC) returned by the correlation algorithm. FIG. 3 shows a plot of RPC vs. SOC for a typical lithium-ion battery.

As with the prior described method, the thermocouple 7 attached to the side of battery 100 can provide battery temperature as an input to computer 1 via signal interface 2. The RPC correlation algorithm will now use three inputs—battery type, open-circuit voltage, and battery temperature. For example, linear interpolation or a similar calculation can calculate state of charge (SOC) for a battery 100 at a temperature intermediate to temperature values associated with stored tables.

Method 3—Using Both OCV and RPC to Determine State of Charge

We have found it advantageous for the computer 1 to perform a temperature compensated open-circuit voltage (OCV) correlation algorithm as described above, followed by a temperature compensated ramp-peak current (RPC) correlation algorithm, and combine, for example by averaging, to obtain a best estimate state of charge (SOC).

What is claimed is:

1. A method for creating a look-up table of ramp-current versus state of charge for a lithium-ion battery, said method comprising the steps of:

(a) bringing the battery to a first present state of charge;
(b) applying a monotonically increasing current to said battery from a power supply, where there is a dependence of current increase with time;
(c) recording said dependence of current increase with time;
(d) increasing said monotonically increasing current to said battery until the current reaches a value defined as the ramp-peak current at the first present state of charge for said lithium-ion battery where either
 (i) a measured voltage for said battery reaches a predetermined maximum, or
 (ii) said monotonically increasing current equals a maximum current rating of the power supply;
(e) recording said ramp-peak current at the present state of charge;
(f) repeating said steps (a), (b), (c), (d), and (e) for additional present states of charge, said recording step (e) recording said ramp-peak currents for the additional states of charge for said battery; and
(g) creating the look-up table of ramp-peak current versus state of charge for the lithium-ion battery using the first and additional present states of charge for said battery.

2. The method in accordance with claim 1 wherein said monotonically increasing current is an electrical current increasing from 0 amps to 20 amps in 60 seconds.

3. The method in accordance with claim 1 wherein the first and additional present states of charge for said battery are 10%, 20%, 30%, 40%, 50%, 60%, 70%, 80%, 90%, and 100%.

4. The method in accordance with claim, 1 further comprising the steps of:

checking the look-up table for ramp-current versus state of charge for duplicate ramp-current values; and
repeating the steps of claim 1 for the states of charge with duplicate ramp-peak current values, except wherein the monotonically increasing current to said battery from said power supply has a different dependence of current increase with time.

5. The method in accordance with claim 1 wherein all the steps of claim 10 are repeated at a set of predetermined temperatures.

6. The method in accordance with claim 5 wherein the set of predetermined temperatures consists of −30° C., 0° C., +20° C., and +50° C.

* * * * *